United States Patent [19]
Jaskolski et al.

[11] Patent Number: 4,458,287
[45] Date of Patent: Jul. 3, 1984

[54] THERMALLY PROTECTED SEMICONDUCTOR WITH ACCURATE PHASE CONTROL

[75] Inventors: Stanley V. Jaskolski, Sussex, Wis.; Robert W. Lade, Ft. Myers, Fla.; Herman P. Schutten, Milwaukee; Gordon B. Spellman, Mequon, both of Wis.

[73] Assignee: Eaton Corporation, Cleveland, Ohio

[21] Appl. No.: 421,940

[22] Filed: Sep. 23, 1982

[51] Int. Cl.³ .............................................. H02H 5/04
[52] U.S. Cl. ..................................... 361/103; 357/28; 357/33
[58] Field of Search .................. 361/54, 56, 91, 100, 361/101, 103; 357/28, 33

[56] References Cited

U.S. PATENT DOCUMENTS

| | | |
|---|---|---|
| Re. 30,514 | 2/1981 | Hyink et al. . |
| 3,609,457 | 9/1971 | Squiers .................. 357/28 X |
| 3,708,720 | 1/1973 | Whitney et al. . |
| 4,050,083 | 9/1977 | Jaskolski et al. ............. 361/103 X |

FOREIGN PATENT DOCUMENTS 2755081  6/1979  Fed. Rep. of Germany ........ 357/28

Primary Examiner—Harry E. Moose, Jr.
Attorney, Agent, or Firm—C. H. Grace; M. E. Taken

[57] ABSTRACT

A power thyristor is provided with a pair of antiseries back to back diode junctions forming an open base transistor thermally coupled to the thyristor and electrically connected between the thyristor gate and cathode. The diode junctions shunt gate current above a given sensed temperature of the power thyristor, for protecting the latter by preventing turn-on thereof. The diode junctions have nonsymmetrical leakage current characteristics to insure protective shunting of forward gate drive in one direction but blocking leakage in the other direction to prevent draining a reverse charged phasing capacitor. The latter is thus charged beginning from the same starting reference point in each cycle whereby to insure accurate phase control in an AC gating system.

12 Claims, 1 Drawing Figure

THERMALLY PROTECTED SEMICONDUCTOR WITH ACCURATE PHASE CONTROL

BACKGROUND AND SUMMARY

Thermally self-protected power switching semiconductor devices are known. For example, Hyink et al, U.S. Pat. Re. No. 30,514 shows a temperature sensitive thyristor thermally coupled to a power switching thyristor and shunting gate drive above a predetermined temperature to protect the latter by preventing turn-on. The temperature device is electrically connected in parallel with the gate of the power device and senses the temperature of the latter. In one embodiment, the thermal device may be of a semiconductor material such as germanium having a lower energy band gap than the semiconductor material of the power device such as silicon. The lower energy band gap of the thermal element insures that gate current will be shunted therethrough because of its lower junction voltage drop.

Whitney et al, U.S. Pat. No. 3,708,720 also discloses a silicon power device having a germanium thermal element in parallel with the gate for shunting purposes at elevated temperatures. The thermal element is provided by a pair of antiseries back to back germanium diodes. A DC gating source is used.

The present invention provides an improved thermally protected semiconductor switch, particularly affording accurate phase control even with AC gate drive. The accurate phase control is afforded by antiseries back to back diode junctions having nonsymmetrical leakage currents. At a given elevated temperature, leakage current flow through the diode pair is substantially greater in one direction than in the opposite direction. This enables forward gate drive to be shunted through the diode pair, but reverse gate drive to be blocked.

The latter blocking action prevents the draining of a reverse charged timing capacitor such that the latter is always at the same reference point when the positive half cycle starts. Since the phasing capacitor begins charging from the same reference level during each positive half cycle, the charging time will be the same, thus affording accurate phase control in firing the power switch.

In prior devices, without the noted nonsymmetrical leakage characteristics, one must tolerate the trade-off between protective shunting and phase control accuracy in AC gate applications. On the one hand, thermally induced leakage current must be great enough to insure shunting of forward gate drive, and thus afford protection for the power switch. On the other hand, minimal leakage current and large blocking capability is desired in the other half cycle so as to prevent drainage of a reverse gate drive charged phasing capacitor. The present invention affords both of these heretofore incompatible results.

DETAILED DESCRIPTION

Figure 1:
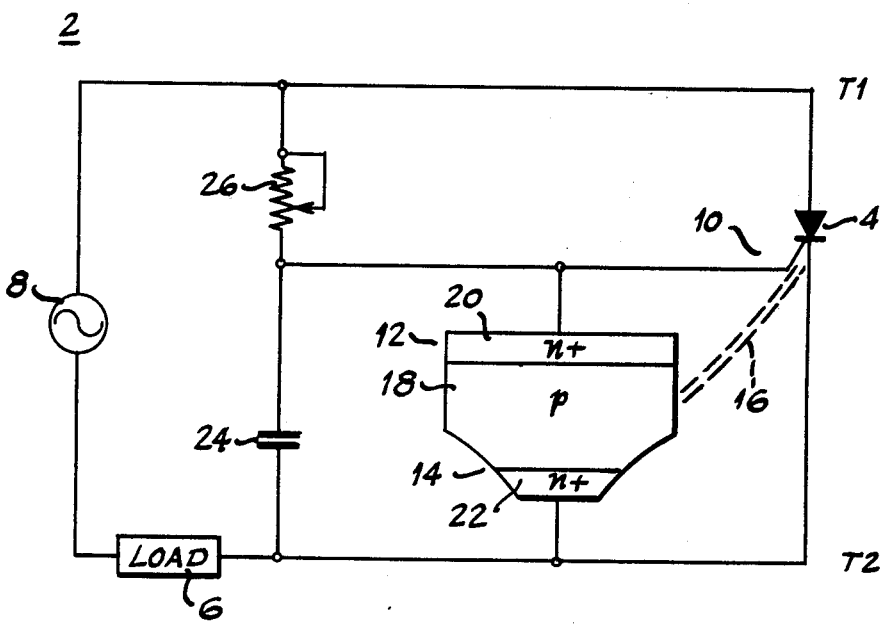
FIG. 1 is a schmatic circuit diagram of a semiconductor switch constructed in accordance with the invention.

FIG. 1 shows a semiconductor device 2 including a semiconductor power switch such as thyristor 4 having first and second main terminals T1 and T2 connectable to an AC load line for controllable carrying load current through load 6 from AC source 8. Thyristor 4 has a control or gate terminal 10 for controlling the conduction state thereof.

First and second antiseries back to back diode junctions 12 and 14 are thermally coupled as shown at 16 to thyristor 4 and electrically connected between thyristor gate 10 and main terminal T2. Diode junctions 12 and 14 are of a semiconductor material such as germanium having a lower energy band gap than the semiconductor material of the power switch or thyristor 4 such as silicon.

Diode junctions 12 and 14 have nonsymmetrical leakage currents. The diode junctions are preferably formed by a central semiconductor region 18 of one conductivity type, such as p type, having first and second outer regions 20 and 22 on opposite sides thereof and of the other conductivity type, such as n type. The first diode junction 12 between first region 20 and central region 18 has a substantially larger area than the second diode junction 14 between second region 22 and central region 18. Thermally induced reverse leakage current across first diode junction 12 is thus substantially greater than thermally induced reverse leakage current across second diode junction 14. It is preferred that the area of first diode junction 12 be greater than the area of second diode junction 14 by a factor of at least 5. The best results have been obtained where this factor is between 6 and 10. For example, if the diameter of junction 14 is 1 unit and the diameter of junction 12 is 3 units, then the area of junction 12 will be a factor of 9 greater than the area of junction 14.

In one implementation, RC time constant means including capacitor 24 and adjustable resistor 26 is provided for driving the thyristor gate 10 when charged from the AC load line. In operation during the first half cycle of the AC load line when T1 is positive with respect to T2, thyristor 4 is gated into conduction when the charge on capacitor 24 reaches a given triggering threshold voltage. First diode junction 12 is normally blocking at low safe operating temperatures of thyristor 4 sensed through thermal coupling 16. Increasing temperatures of thyristor 4 increases the thermally induced leakage current across first diode junction 12 such that at a given elevated temperature junction 12 shunts forward gate current thereacross and across forward biased junction 14, which prevents turn-on of thyristor 4 in the next cycle, to protect the latter.

During the second half cycle of the AC load line when T1 is negative with respect to T2, capacitor 24 is reverse charged to a value set by the reverse clamping across the thyristor junction between main terminal T2 and gate 10. For example in a PNPN thyristor or SCR, a reverse biased cathode to gate junction exhibits the known zener type voltage clamping. A typical reverse clamping voltge is 15 volts, and thus the upper plate of capacitor 24 is charged to a minus 15 volts but does not charge any lower as the second half cycle continues, with T1 going further negative.

During the second half cycle, second diode junction 14 is normally blocking, and continues to be blocking even at increasing temperatures of thyristor 4 sensed through coupling 16. Junction 14 remains blocking even at the mentioned elevated temperature due to its substantially smaller area than first diode junction 12. The reverse or negative charge on capacitor 24 is thus not drained off through second diode junction 14. The reverse charge on capacitor 24 thus is the same for all second half cycles of the AC load line. During the first half cycle, capacitor 24 is thus charged starting from the same reference point, e.g. minus 15 volts. The charging time for raising capacitor 24 to the given positive triggering threshold voltage will thus be the same during all first half cycles, whereby thyristor 4 is triggered into conduction at the same relative point in each cycle, thus affording accurate phase control of energization of load 6. In the example given, the minus 15 volts on the upper plate of capacitor 24 is a consistent starting reference level from which the capacitor is positively charged during each first half cycle.

Without the nonsymmetrical leakage characteristics of junctions 12 and 14, a significant trade-off must be tolerated between (a) protective shunting of forward gate drive and (b) variable leakage of reverse gate drive and draining of reverse charged capacitor 24 with resulting loss of accuracy in phase control. On the one hand, thermally induced leakage current must be great enough to insure shunting and thus afford protection for the power switch 4. On the other hand, minimal leakage current and large blocking capability is desired in the other half cycle so as to prevent drainage of reverse gate drive and thus insure that the phasing capacitor will be charged beginning from the same starting reference point during each positive half cycle. The present invention affords both of these heretofore incompatible results.

In preferred form, diode junctions 12 and 14 are provided by an open base transistor, as shown in FIG. 1. A central base region 18 is between an emitter region 20 and a collector region 22. Starting with a p type substrate 18, n+ diffusions are performed on the top and bottom, yielding regions 20 and 22. Standard mesa etching is then performed, yielding the device shown.

It is recognized that various modifications are possible within the scope of the appended claims.

We claim:

1. A semiconductor switch comprising:
   a power thyrsitor having first and second main terminals for carrying load current and a gate for controlling the conduction state thereof; and
   first and second antiseries back to back diode junctions thermally coupled to said thyristor and electrically connected between said thyristor gate and said second main terminal, said diode junctions being of semiconductor material having lower energy band gap than the semiconductor material of said thyristor, said diode junctions having nonsymmetrical leakage currents.

2. The invention according to claim 1 wherein said diode junctions are formed by a central semiconductor region of one conductivity type having first and second other conductivity type outer regions on opposite sides thereof, the first diode junction between said first and central regions having a substantially larger area than the second diode junction between said second and central regions, such that thermally induced reverse leakage current across said first diode junction is substantially greater than thermally induced reverse leakage current across said second diode junction.

3. The invention according to claim 2 wherein said thyristor is connectable across an AC load line, and comprising RC time constant means for driving said thyristor gate when charged from said AC load line, such that during the first half cycle of said AC load line, said thyristor is gated into conduction when the charge on the capacitor of said RC means reaches a given triggering threshold voltage, said first diode junction being normally blocked at low safe operating temperatures of said thyristor, said first diode junction sensing the temperature of said thyristor through said thermal coupling such that increasing temperature of the latter increases the thermally induced leakage current across said first diode junction whereby the latter shunts gate current and prevents turn-on of said thyristor in the next cycle, to protect the latter, and
such that during the second half cycle of said AC load line, said capacitor is reverse charged to a value set by the reverse clamping across the thyristor junction between said second main terminal and gate, said second diode junction being normally blocking and continuing to be blocking even at said increasing temperatures, due to its substantially smaller area than said first diode junction, whereby said reverse charge on said capacitor is not drained off through said second diode junction, whereby the reverse charge on said capacitor is the same for all second half cycles of said AC load line, and during the first half cycle said capacitor is charged starting from the same reference point and thus the charging time for raising said capacitor to said given triggering threshold voltage will be the same during all first half cycles, thus affording accurate phase control.

4. The invention according to claim 3 wherein the area of said first diode junction is greater than the area of said second diode junction by a factor of at least 5.

5. The invention according to claim 4 wherein said factor is between 6 and 10.

6. A semiconductor switch comprising: a power thyristor having first and second main terminals for carrying load current and a gate for controlling the conduction state thereof; and first and second antiseries back to back diode junctions thermally coupled to said thyristor and electrically connected between said thyristor gate and said second main terminal, said diode junctions being of semiconductor material having a lower energy band gap than the semiconductor material of said thyristor, said first diode junction having a substantially larger area than said second diode junction, such that thermal leakage current through said diode junction pair is substantially greater in one direction than in the other direction.

7. The invention according to claim 6 wherein said thyristor is connectable across an AC load line, and comprising RC means for driving said thyristor gate in phase control relation,
   said first diode junction sensing the temperature of said thyristor through said thermal coupling and shunting gate current in response to increasing temperature due to its lower energy band gap, to protect said thyristor by preventing turn-on thereof,
   said second diode junction remaining blocking at said increasing temperatures, such that reverse gate drive current is not leaked therethrough,
   such that at a given elevated temperature of said thyristor, forward gate current is leaked through said diode pair, but reverse gate current is not.

8. The invention according to claim 7 wherein:
during the first half cycle of said AC load line, said thyristor is gated into conduction when the charge on the capacitor of said RC means reaches a given triggering threshold voltage, said first diode junction being normally blocking at low safe operating temperatures of said thyristor, said first diode junction sensing the temperature of said thyristor through said thermal coupling such that increasing temperature of the latter increases the thermally induced leakage current across said first diode junction whereby the latter shunts forward gate current at said elevated temperature and prevents turn-on of said thyristor in the next cycle; and during the second half cycle of said AC load line, said capacitor is reverse charged to a value set by the reverse clamping across the thyristor junction between said second main terminal and gate, said second diode junction being normally blocking and continuing to be blocking at said elevated temperature, whereby said reverse charge on said capacitor is not drained off through said second diode junction, such that the reverse charge on said capacitor is the same for all second half cycles of said AC load line, and such that during the first half cycle said capacitor is forwardly charged starting from the same negative charge reference point and thus the charging time for raising said capacitor to said given triggering threshold voltage will be the same during all first half cycles, thus affording accurate phase control.

9. A semiconductor switch comprising:

a power thyristor having first and second main terminals for carrying load current and a gate for controlling the conduction state thereof; and integrated first and second antiseries back to back diode junctions forming an open base transistor thermally coupled to said thyristor and electrically connected between said thyristor gate and said second main terminal, said transistor being of semiconductor material having a lower energy band gap than the semiconductor material of said thyristor, said transistor having nonsymmetrical leakage current flow therethrough in opposing directions.

10. The invention according to claim 9 wherein:

said thyristor semiconductor material is silicon;

and said transistor semiconductor material is germanium, and comprises a central base region of one conductivity type between emitter and collector regions of opposite conductivity type, the first diode junction being the emitter-base junction and having a substantially larger area than the second diode junction which is the collector-base junction, such that thermally induced reverse leakage current across said emitter-base junction is substantially greater than thermally induced reverse leakage current across said collector-base junction, such that at a given elevated temperature of said thyristor, forward gate current is shunted by leakage through said transistor but reverse gate current is not leaked through said transistor in the other direction.

11. A semiconductor device comprising:

a semiconductor power switch having first and second main terminals connectable to an AC load line, and a control terminal connectable to an AC triggering signal for controlling the conduction state thereof; and first and second antiseries back to back diode junctions thermally coupled to said power switch and electrically connected between said control terminal and said second main terminal, said diode junctions being of semiconductor material having a lower energy band gap than the semiconductor material of said power switch, said diode junctions having nonsymmetrical leakage currents.

12. The invention according to claim 11 wherein said first diode junction has a substantially larger area than said second diode junction such that thermally induced reverse leakage current across said first diode junction is substantially greater than thermally induced reverse leakage current across said second diode junction.

* * * * *